United States Patent
Bernstein et al.

(10) Patent No.: US 6,339,626 B1
(45) Date of Patent: Jan. 15, 2002

(54) MRI SYSTEM WITH FRACTIONAL DECIMATION OF ACQUIRED DATA

(75) Inventors: Matthew A. Bernstein, Waukesha; Jason A. Polzin, Lake Mills; Bo J. Petersson, Wauwatosa; Frederick J. Frigo, Waukesha, all of WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 09/039,436

(22) Filed: Mar. 16, 1998

(51) Int. Cl.$^7$ .................................................. H04L 7/00
(52) U.S. Cl. ......................... 375/355; 324/307; 341/61; 382/299
(58) Field of Search ................................. 375/225, 219, 375/285, 340, 346, 355; 341/61, 126, 155, 166; 364/724.1; 382/128, 299; 324/307, 309

(56) References Cited

U.S. PATENT DOCUMENTS

| | | | |
|---|---|---|---|
| 4,980,457 A | * 12/1990 | Kaufman et al. | 324/309 |
| 5,410,616 A | * 4/1995 | Kidd | 382/299 |
| 5,537,435 A | * 7/1996 | Carney et al. | 375/219 |
| 5,545,990 A | * 8/1996 | Kiefer et al. | 324/307 |
| 5,602,476 A | * 2/1997 | Liu et al. | 324/309 |
| 5,644,646 A | * 7/1997 | Du et al. | 382/128 |
| 5,892,694 A | * 4/1999 | Ott | 364/724.1 |
| 5,903,232 A | * 5/1999 | Zarubinsky et al. | 341/61 |
| 6,025,714 A | * 2/2000 | Avram et al. | 324/309 |

OTHER PUBLICATIONS

A.K. Jain, "Fundamentals of Digital Image Processing", p. 1, 1989.*

* cited by examiner

Primary Examiner—Stephen Chin
Assistant Examiner—Chieh M. Fan
(74) Attorney, Agent, or Firm—Quarles & Brady, LLP; Christian G. Cabou

(57) ABSTRACT

An MRI system acquires NMR signals and digitizes them at a fixed sample rate. A lower, prescribed sample rate is obtained by fractionally decimating the sampled NMR signals. Fractional decimation is achieved by a combination of zeropadding the sampled NMR signal in the frequency domain and decimating the sampled NMR signal in the time domain.

10 Claims, 3 Drawing Sheets

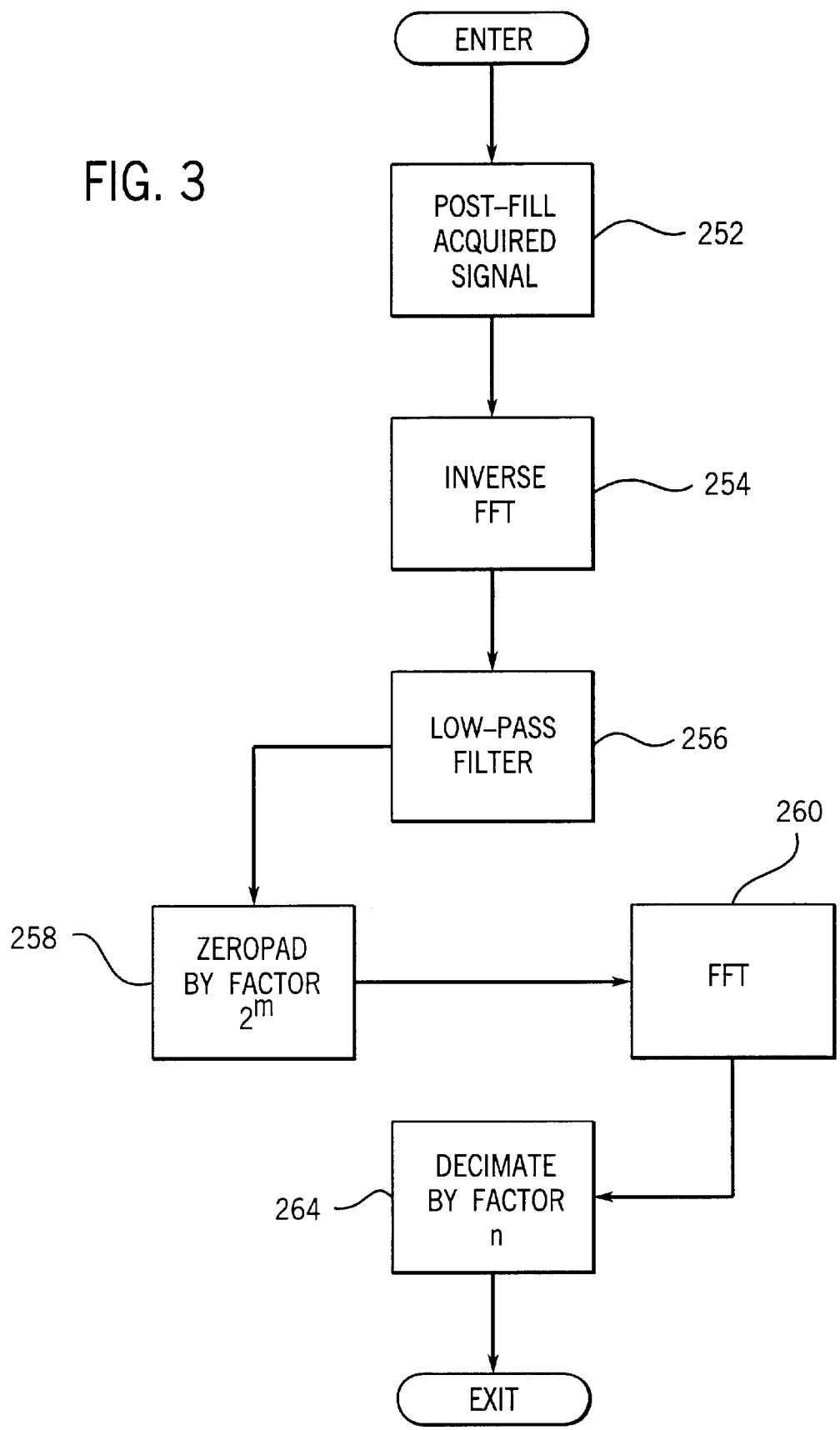

MRI SYSTEM WITH FRACTIONAL DECIMATION OF ACQUIRED DATA

BACKGROUND OF THE INVENTION

The field of the invention is nuclear magnetic resonance imaging methods and systems. More particularly, the invention relates to the sampling of acquired NMR signals at prescribed sample rates.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The rate at which the received NMR signals are digitized is an important scan parameter. The signal-to-noise ratio of an NMR image can be improved if the effective bandwidth (which is the inverse of the sampling period per point) is reduced. This is usually accomplished by widening the read-out gradient pulse and reducing the amplitude of the read-out gradient to encode the positions into a narrower bandwidth and to retain the same spatial resolution. The anti-aliasing filters are modified to match the reduced bandwidth and the analog-to-digital conversion (A/D) sample rate is reduced to acquire the same number of samples over the longer read-out gradient pulse. The SNR improvement is proportional to the square root of the bandwidth reduction.

A higher SNR and corresponding lower A/D sample rate is not always desired, since the increase in SNR is accompanied by two disadvantages. First, the minimum echo delay ($TE_{1min}$) for the first NMR echo signal is increased due to the widening of the read-out gradient pulse. For some rf spin echo acquisitions the delay is twice what might be expected, since the time between the 90° RF excitation pulse and the 180° RF pulse must also be increased to orient the NMR echo signal at the center of the widened read-out gradient pulse. The lengthening of $TE_1$ is a disadvantage when $T_2$ weighting of the NMR image is not desired. A second disadvantage which accompanies this increase in SNR is an increase in chemical shift artifacts. Since the bandwidth per image pixel is reduced, the frequency difference between lipid and water resonances becomes more significant. For example, at 1.5 Tesla main field strength, the approximately 220 Hertz difference in resonant frequency will appear approximately three times further apart in an image where each image pixel represents a difference in frequency of 42 Hertz rather than 125 Hertz. The result is an increased relative displacement between the lipid structures and the water structures. This displacement can be especially disturbing with images reconstructed from the first NMR echo signal since the second echo signal often has lower lipid signal components due to the shorter $T_2$ decay time of lipids.

To allow maximum flexibility of the SNR, spatial resolution and field of view of an image for each particular application, a completely adjustable A/D sampling rate is desirable.

A number of methods have been used in prior MRI systems to enable the A/D sample rate to be precisely prescribed to enable the best image acquisition possible. One approach is to employ an analog-to-digital converter circuit ("ADC") in which the sample rate is adjustable and can be precisely controlled. Such ADCs are expensive.

Another approach is to employ an ADC which has a fixed sample rate far higher than that required to achieve the desired sample rates. The sample rate is reduced to the prescribed A/D sample rate by using decimation. The decimation ratio (r) is an integer value. Decimation effectively reduces the A/D sample rate to one-half (r=2) by selecting alternate digitized samples, to one-third (r=3) by selecting every third digitized sample, to one-fourth (r=4) by selecting every fourth digitized sample, etc. The difficulty with this method is that the effective A/D sample rate can only be changed in discrete steps. If the ADC sample rate is very high and the decimation ratio (r) necessary to achieve operable A/D sample rates is very high (e.g. r=10, 11, 12), these discrete steps are relatively small and a desired A/D sample rate can be achieved with reasonable accuracy. However, ADC devices that operate at such high sample rates are expensive.

SUMMARY OF THE INVENTION

The present invention is a method for using a fixed sample rate ADC to acquire NMR image data and providing a fractional decimation to produce the prescribed sample rate. The decimation ratio is expressed as $r=n/2^m$, where n and m are integers that may be selected to obtain the prescribed sample rate. The selected decimation ratio is achieved by Fourier transforming the NMR signal to the frequency domain, zeropadding the transformed signal by a factor $2^m$, Fourier transforming the zeropadded signal back to the time domain, and decimating the zeropadded time domain signal by a factor n.

A general object of the invention is to provide finer control over the decimation ratio so that desired rates can be more accurately achieved with a fixed rate analog to digital converter. By combining decimation in the time domain with zeropadding in the frequency domain, the decimation ratio (r) can be set to many more discrete values. This enables a decimation ratio (r) to be selected which more closely produces the desired sample rate.

BRIEF DESCRIPTION OF THE DRAWINGS

FIG. 3 is a flow chart of the method used by the MRI system of FIG. 1 to practice the present invention.

DESCRIPTION OF THE PREFERRED EMBODIMENT

Figure 1:
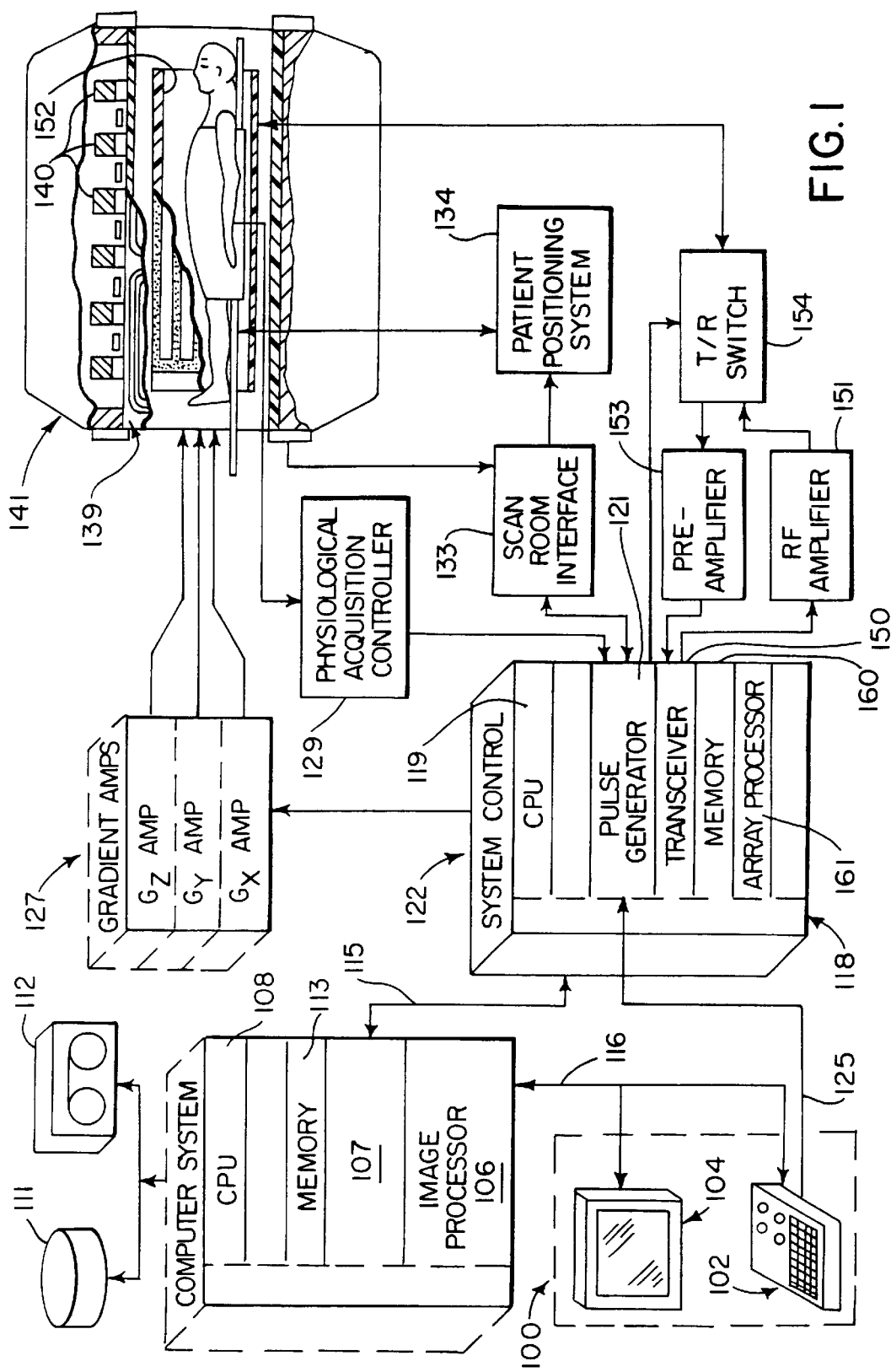
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a wholebody RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
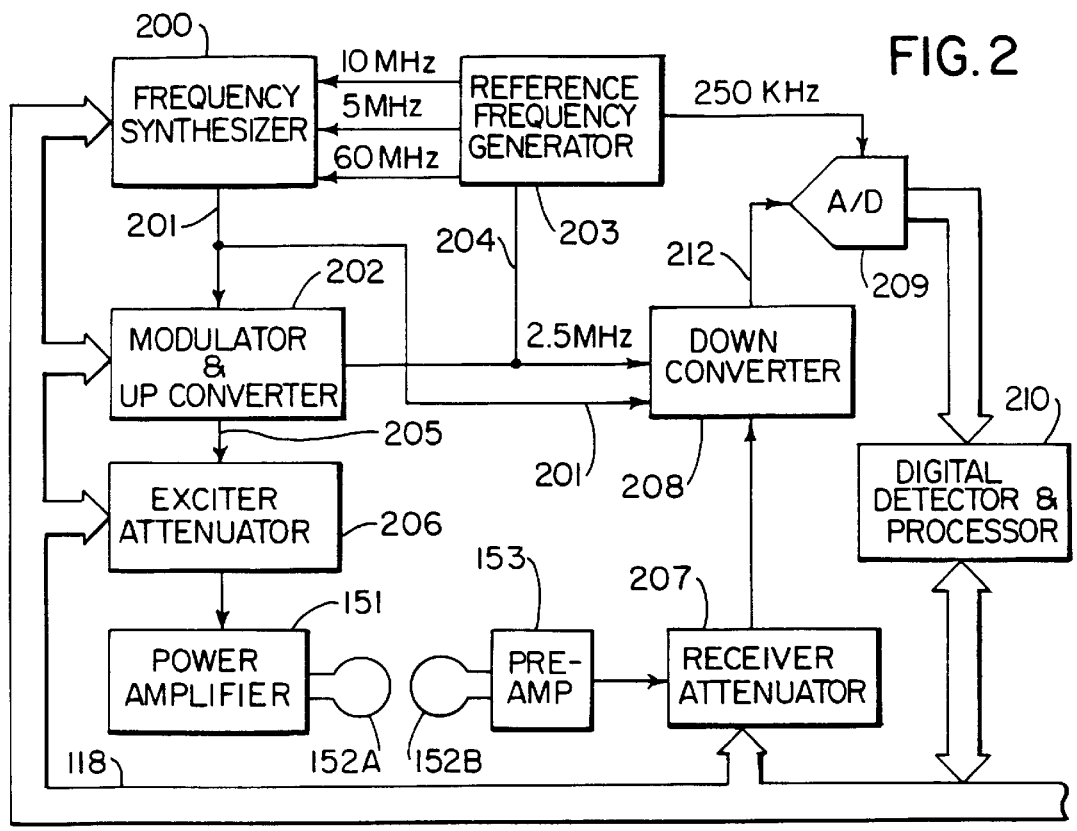
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIG. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 205 MHz reference signal on line 204. The down converted NMR signal is applied to the input of an analog-to-digital converter (ADC) 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image. In the preferred embodiment the ADC 209 operates at a fixed sample rate of 500 kHz so that complex pairs I and Q are sampled at a 250 kHz rate, yielding a maximum bandwidth of ±125 kHz.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

The present invention is implemented on the digitized I and Q samples of each acquired NMR signal. A prescribed receive bandwidth is established prior to the scan, and from this value a desired decimation ratio is calculated to reduce the 250 kHz=±125 kHz fixed sample rate of the ADC 109. For example, if the prescribed bandwidth is ±100 kHz, a decimation ratio of 5/4 is needed (i.e. 125/100=5/4).

The decimation ratio (r) produced by the present invention is a function of a decimation factor (n) and a zeropadding factor ($2^m$) in accordance with the following formula:

$$r = n/2^m.$$

The values of the integers n and m which produce the closest value to the desired decimation ratio (r) are calculated. In the example above, the 5/4 decimation ratio can be produced exactly by setting n=5 and m=2. In practice, a table of sample rates and the factors n and m which produce each rate are stored in the system control 122. The sample rate closest to that which is prescribed is looked up in this table and the values of the factors n and m are read out and used in the following process.

Referring particularly to FIG. 3, the first step in the fractional decimation method is to post-fill after the digitized signal with zeroes as indicated at process block 252. This is done to ensure that the length of the signal is a power of 2 (e.g. 512, 1024, 2048) so that an inverse fast Fourier transform ($FFT^{-1}$) can be performed in the next step indicated at process block 254. The inverse FFT transforms the time domain NMR signal samples into a corresponding number of signal components which represent the frequency domain version of the NMR signal. Signal components in this frequency domain representation of the NMR signal which are outside the prescribed bandwidth are suppressed by a multiplicative low-pass filter 256.

The next step in the fractional decimation process is to zeropad the frequency domain NMR signal as indicated at process block 258. The number of zeros added to the frequency domain NMR signal is determined by the zeropadding factor m. The total number of components in the NMR signal plus those added by the zeropadding must be a power of two for the FFT which follows. The number of zeros added is thus given by the following expression:

$$(2^m - 1) \text{ (number of NMR signal components)}.$$

For example, if m=1, then zeros equal in number to the NMR signal component size are added to double the component size of the frequency domain NMR signal. If m=2, then zeros equal in number to three times the NMR signal size are added as zeropadding. Half the total number of zeroes are added symmetrically to both sides of the NMR signal.

After the zeropadding is completed the NMR signal is transformed back to the time domain by performing a fast Fourier transform (FFT) as indicated at process block 260. A decimation process is then performed as indicated at process block 264. This decimation process 264 selects one sample out of each n successive samples in the transformed time domain NMR signal. The result of this fast Fourier transformation may be scaled by a multiplicative factor that depends on the value m. As a result, a digitized time domain representation of the NMR signal is produced which is reduced to the prescribed sample rate. This decimated signal is ready for use in the image reconstruction process described above.

The fractional decimation process of the present invention enables one to obtain a decimation ratio (r) which can be changed in finer steps compared to integer decimation, even when the fixed sample rate of the ADC is slightly higher than the desired sample rate. This is because the decimation ratio (r) is controlled by two factors, (n) and (m) in accordance with the relationship $$r = n/2^m.$$

In the preferred embodiment n is odd, and a table of fractional decimation ratios is stored along with the factors (n) and (m) required to produce them. An example of such a table is as follows.

| | | n → | | | |
|---|---|---|---|---|---|
| | | 3 | 5 | 7 | 9 |
| m | 1 | 1.5 | 2.5 | 3.5 | 4.5 |
| ↓ | 2 | | 1.25 | 1.75 | 2.25 |
| | 3 | | | | 1.125 |

The full effective bandwidth can be determined from the fractional decimation ratio ($r = n/2^m$) and the fixed sample rate of the ADC 209 by the relationship:

$$\text{effective bandwidth} = \text{sample rate}/r.$$

Since the effective bandwidth is prescribed by the operator, and the sample rate of the ADC 209 is fixed, the fractional decimation ratio (r) can be computed from this equation. To minimize computation, constraints may be imposed on the fractional decimation rates used. A limit on the maximum value of m serves this purpose. If such a constraint is imposed, the best match to the desired decimation ratio is looked-up in the stored table and the factors n and m are read therefrom, and used in the fractional decimation process described above.

What is claimed is:

1. A method for producing an NMR signal at a desired sample rate using an analog-to-digital converter having a fixed sample rate, the steps comprising:
    a) acquiring an NMR signal with the analog-to-digital converter at the fixed sample rate and storing the resulting set of complex time domain NMR signal components;
    b) inverse Fourier transforming the complex time domain NMR signal samples to produce a corresponding set of complex frequency domain NMR signal components;
    c) zeropadding the set of complex frequency domain NMR signal components to increase the number of components by a zeropadding factor $2_m$;
    d) Fourier transforming the zeropadded complex frequency domain NMR signal components to produce a corresponding set of expanded complex time domain NMR signal samples; and
    e) decimating the expanded complex time domain NMR signal samples by using a decimation factor n to produce the NMR signal;
    wherein the values of m and n are selected to provide a decimation ratio r such that the sample rate of the NMR signal produced in step e) best approximates the desired sample rate.

2. The method as recited in claim 1 which includes filtering the set of complex frequency domain NMR signal components produced in step b) to have a prescribed bandwidth.

3. The method as recited in claim 1 in which the decimation ratio r is greater than one and is equal to $n/2^m$, and the factor n is an odd integer and m is an integer.

4. The method as recited in claim 1 in which decimation ratios r and corresponding values of m and n are stored in a table, and the values of m and n are read from this table.

5. The method as recited in claim 1 which includes scaling the set of expanded complex time domain NMR signal samples by a multiplicative factor which depends on the value m.

6. An analog-to-digital converter for producing digitized, complex samples of an NMR signal received by a magnetic resonance imaging system at a prescribed sample rate, the combination comprising:

- an analog-to-digital converter having an input connected to receive the NMR signal and being operable to produce a set of complex digital signals which sample the NMR signal at a fixed sample rate;
- a memory for storing the set of complex digital signals;
- a first processor for performing an inverse Fourier transformation on the set of complex digital signals to produce a corresponding set of transformed complex digital signals;
- a second memory for storing the transformed complex digital signals; means for zeropadding the transformed complex digital signals to increase the number of transformed complex digital signals stored in the second memory by a zeropadding factor $2^m$;
- a second processor for performing a Fourier transformation on the transformed complex digital signals stored in the second memory to produce a corresponding set of expanded complex digital signals;
- a third memory for storing the set of expanded complex digital signals; and
- a third processor for decimating the set of expanded complex digital signals using a decimation factor n, wherein the values of m and n are selected to provide a decimation ratio r such that the decimation processor produces a set of complex digital signals representative of the NMR signal sampled at the prescribed sample rate.

7. The analog-to-digital converter as recited in claim 6 which includes a filter connected to limit the bandwidth of the set of transformed complex digital signals to a prescribed amount.

8. The analog-to-digital converter as recited in claim 6 in which the decimation ratio r, is greater than one and is equal to $n/2^m$ and the factor n is an odd integer and m is an integer.

9. The analog-to-digital converter as recited in claim 6 which includes a memory for storing a table which stores values for m and n for different values of decimation ratios r, and the processor for decimating reads the values for m and n from this table which correspond to the required decimation ratio r.

10. The analog-to-digital convertor as recited in claim 6 which includes means for scaling the set of expanded complex digital signals by multiplying them by a factor which depends on the value of m.

* * * * *